(12) United States Patent
Standing

(10) Patent No.: US 9,741,635 B2
(45) Date of Patent: Aug. 22, 2017

(54) ELECTRONIC COMPONENT

(71) Applicant: Infineon Technologies Austria AG, Villach (AT)

(72) Inventor: Martin Standing, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 14/160,041

(22) Filed: Jan. 21, 2014

(65) Prior Publication Data

US 2015/0206820 A1    Jul. 23, 2015

(51) Int. Cl.
  *H01L 23/367*  (2006.01)
  *H01L 23/373*  (2006.01)
  *H01L 23/538*  (2006.01)
  *H01L 23/433*  (2006.01)

(52) U.S. Cl.
  CPC ........ *H01L 23/367* (2013.01); *H01L 23/3733* (2013.01); *H01L 23/5389* (2013.01); *H01L 23/373* (2013.01); *H01L 23/4334* (2013.01); *H01L 2224/04105* (2013.01); *H01L 2224/06181* (2013.01); *H01L 2224/2518* (2013.01); *H01L 2224/73267* (2013.01); *H01L 2924/1203* (2013.01); *H01L 2924/1305* (2013.01); *H01L 2924/13055* (2013.01); *H01L 2924/13091* (2013.01)

(58) Field of Classification Search
  CPC .................................................. H01L 23/3672
  See application file for complete search history.

(56) References Cited

U.S. PATENT DOCUMENTS

| | | | | |
|---|---|---|---|---|
| 5,315,154 A | * | 5/1994 | Elwell | 257/707 |
| 6,191,478 B1 | * | 2/2001 | Chen | 257/718 |
| 6,462,410 B1 | * | 10/2002 | Novotny et al. | 257/707 |
| 7,626,261 B2 | * | 12/2009 | Baek et al. | 257/714 |
| 8,081,468 B2 | * | 12/2011 | Hill et al. | 361/710 |
| 8,106,497 B2 | | 1/2012 | Brunnbauer et al. | |
| 8,110,915 B2 | * | 2/2012 | Fowlkes et al. | 257/692 |
| 8,218,323 B2 | * | 7/2012 | Choudhury et al. | 361/719 |
| 8,218,337 B2 | * | 7/2012 | Choudhury et al. | 361/818 |
| 8,970,028 B2 | * | 3/2015 | Zohni | 257/713 |
| 8,970,029 B2 | * | 3/2015 | Lin et al. | 257/719 |
| 2003/0209802 A1 | | 11/2003 | Awano | |
| 2005/0189647 A1 | * | 9/2005 | Sung | 257/720 |

(Continued)

FOREIGN PATENT DOCUMENTS

| | | |
|---|---|---|
| JP | 2004006757 A | 1/2004 |
| JP | 2006196593 A | 7/2006 |
| KR | 20120129542 A | 11/2012 |

OTHER PUBLICATIONS

Smalc, M., et al., "Thermal Performance of Natural Graphite Heat Spreaders." Proceedings of IPACK2005, ASME InterPack'05, Jul. 17-22, 2005, pp. 1-11, San Francisco, California.

*Primary Examiner* — Eugene Lee

(74) *Attorney, Agent, or Firm* — Murphy, Bilak & Homiller, PLLC

(57) ABSTRACT

An electronic component includes one or more semiconductor dice embedded in a first dielectric layer, means for a spreading heat in directions substantially parallel to a major surface of the one or more semiconductor dice embedded in a second dielectric layer and means for dissipating heat in directions substantially perpendicular to the major surface of the one or more semiconductor dice.

27 Claims, 5 Drawing Sheets

(56) References Cited

U.S. PATENT DOCUMENTS

| | | |
|---|---|---|
| 2006/0060963 A1 | 3/2006 | Chang |
| 2007/0138651 A1* | 6/2007 | Hauenstein ............. H01L 23/13 |
| | | 257/782 |
| 2007/0176277 A1 | 8/2007 | Brunnbauer et al. |
| 2009/0213551 A1 | 8/2009 | Wyland |
| 2009/0260858 A1 | 10/2009 | Nakai et al. |
| 2011/0031602 A1* | 2/2011 | Wowra et al. ................. 257/690 |
| 2015/0035135 A1* | 2/2015 | Hung et al. ................... 257/712 |

* cited by examiner

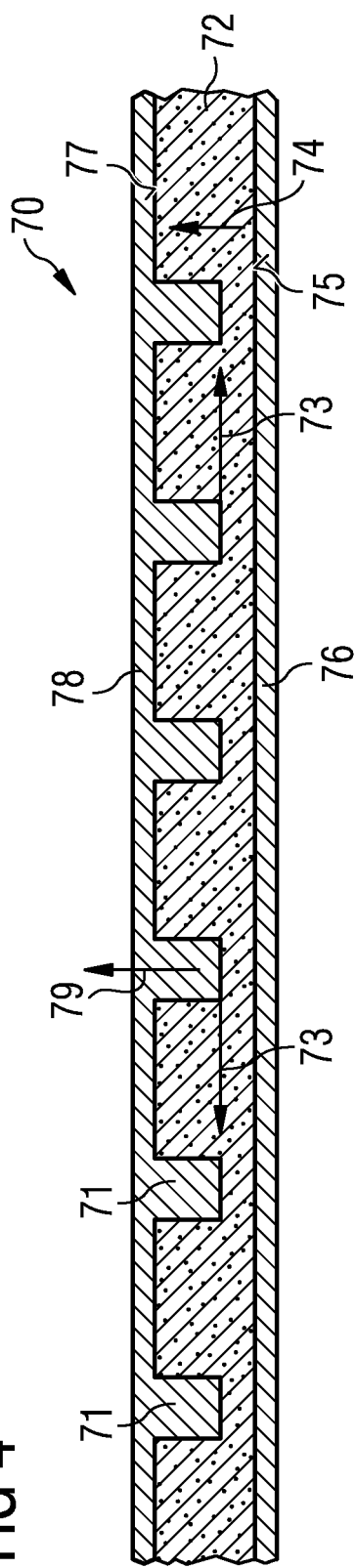
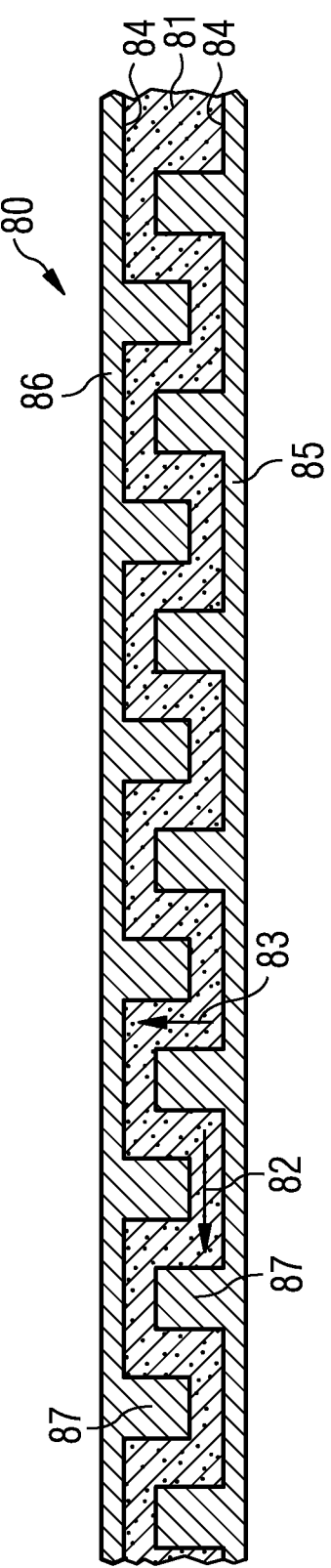
FIG 4
FIG 5

ELECTRONIC COMPONENT

BACKGROUND

Semiconductor devices may generate heat during operation. Excessive amounts of heat may decrease device performance. One approach to reduce the effects of excessive heat on device performance is to provide an additional heat dissipation component which is thermally coupled to the heat generating semiconductor device and which is configured to dissipate heat away from the semiconductor device.

SUMMARY

In an embodiment, an electronic component includes one or more semiconductor dice embedded in a first dielectric layer, a heat-spreader embedded in a second dielectric layer and a heat-sink thermally coupled to the heat-spreader. The heat-spreader has a higher thermal conductivity in directions substantially parallel to the major surface of the one or more semiconductor dice than in directions substantially perpendicular to the major surface of the one or more semiconductor dice.

In an embodiment, an electronic component includes one or more semiconductor dice embedded in a first dielectric layer, means for a spreading heat in directions substantially parallel to a major surface of the one or more semiconductor dice embedded in a second dielectric layer, and means for dissipating heat in directions substantially perpendicular to the major surface of the one or more semiconductor dice.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 4 illustrates a heat-spreader embedded in a dielectric layer according to a first embodiment.

FIG. 5 illustrates a heat-spreader embedded in a dielectric layer according to a second embodiment.

DETAILED DESCRIPTION

Figure 1:
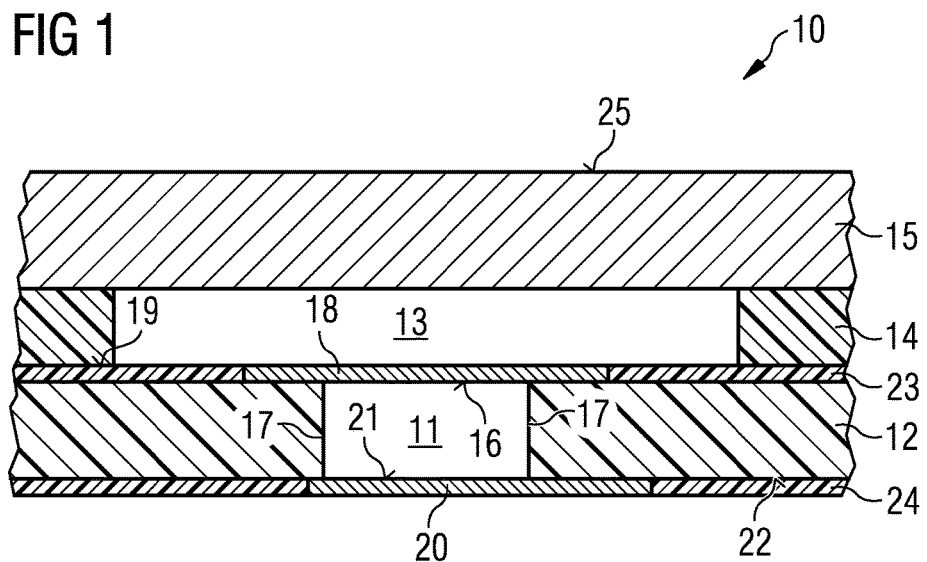
FIG. 1 illustrates a schematic cross-sectional view of an electronic component according to a first embodiment.

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As employed in this specification, the terms "coupled" and/or "electrically coupled" are not meant to mean that the elements must be directly coupled together-intervening elements may be provided between the "coupled" or "electrically coupled" elements.

As used herein, a "high-voltage device", such as a high-voltage depletion-mode transistor, is an electronic device which is optimized for high-voltage switching applications. That is, when the transistor is off, it is capable of blocking high voltages, such as about 300 V or higher, about 600 V or higher, or about 1200 V or higher, and when the transistor is on, it has a sufficiently low on-resistance (RON) for the application in which it is used, i.e., it experiences sufficiently low conduction loss when a substantial current passes through the device. A high-voltage device can at least be capable of blocking a voltage equal to the high-voltage supply or the maximum voltage in the circuit for which it is used. A high-voltage device may be capable of blocking 300 V, 600 V, 1200 V, or other suitable blocking voltage required by the application.

As used herein, a "low-voltage device", such as a low-voltage enhancement-mode transistor, is an electronic device which is capable of blocking low voltages, such as between 0 V and $V_{low}$, but is not capable of blocking voltages higher than $V_{low}$. $V_{low}$ may be about 10 V, about 20 V, about 30 V, about 40 V, or between about 5 V and 50 V, such as between about 10 V and 30 V.

FIG. 1 illustrates a schematic cross-sectional view of an electronic component 10 according to a first embodiment. The electronic component 10 includes a semiconductor die 11 embedded in a first dielectric layer 12, a heat-spreader 13 embedded in a second dielectric layer 14 and a heat-sink 15 which is thermally coupled to the heat-spreader 13. The heat-spreader 13 has a higher thermal conductivity in directions substantially parallel to a major surface 16 of the semiconductor die 11 than in directions substantially perpendicular to the major surface 16 of the semiconductor die 11.

The heat-spreader 13 may have a lateral area which is greater than the lateral area of semiconductor die 11 and, therefore, than the lateral area of the major surface 16. The heat-spreader 13 may be arranged at least partially on the semiconductor die 11 in order to provide good thermal coupling between the heat-spreader 13 and the semiconductor die 11, and on the first dielectric layer 12.

The heat-spreader 13 may be electrically insulated from the semiconductor die 11, for example, by a further dielectric layer arranged between the first dielectric layer 12 and the heat-spreader 13 or by a portion of the first dielectric layer 12 itself if the semiconductor die 11 is embedded within the first dielectric layer 12. The heat-spreader 13 may be electrically insulated form the semiconductor die 11 if, for example, a high voltage contact such as a drain contact of a transistor device faces towards the heat-spreader 13.

In some embodiments, the heat-spreader 13 is electrically coupled to a contact pad that is electrically coupled to the semiconductor die 11. The heat-spreader 13 may be electrically coupled to a ground contact pad, for example.

The electronic component 10 may be considered to have a multi-layer arrangement in which the heat-spreader 13 is embedded in the second dielectric layer 14 which is stacked on the first dielectric layer 12 in which the semiconductor die 11 is embedded. The heat-sink 15 may be stacked on the heat-spreader 13 and on the second dielectric layer 14. The semiconductor die 11 may have a thickness which is substantially similar to the thickness of the first dielectric layer 12. The heat-spreader 13 may have a thickness which is substantially similar to the thickness of the second dielectric layer 14. The heat-sink 15 may be substantially planar and is arranged on the heat-spreader 13 and on the second dielectric layer 14. The heat-sink 15 may also be embedded in a third dielectric layer such that at least the peripheral edges of this layer of the stack are provided by a dielectric. The upper surface of the heat-sink 15 remains uncovered by the dielectric to facilitate heat dissipation from the upper surface of the heat-sink 15.

The heat-spreader 13 may be configured to conduct heat to areas adjacent the side faces 17 of the semiconductor die 11. For example, the heat-spreader 13 may have a lateral area which is greater than that of the semiconductor die 11 which in combination with the anisotropic thermal conductivity may be used to assist the conduction of heat from the semiconductor die 11 to regions of the heat-spreader 13 adjacent the side faces 17 of the semiconductor die 11.

The heat-spreader 13 may have a substantially anisotropic thermal conductivity to assist in conducting a larger portion of the heat in lateral directions than in vertical directions. In this sense, vertical denotes directions substantially perpendicular to the major surface 16 of the semiconductor die 11 and the laterally denotes directions substantially parallel to the major surface 16 of the semiconductor device 11.

The heat-sink 15 may have a substantially isotropic thermal conductivity and may assist in dissipating heat from the heat-spreader 13 in vertical as well as lateral directions. The heat-sink 15 may also be embedded in a third dielectric layer. The third dielectric layer may be arranged on the second dielectric layer.

The heat-spreader 13 has an anisotropic thermal conductivity such that the thermal conductivity is higher in directions substantially parallel to the major surface 16 of the semiconductor die than in directions substantially parallel to the major surface 16 of the semiconductor die 11. This anisotropic thermal conductivity may be provided by particles having anisotropic thermal conductivity and an anisotropic arrangement such that the heat-spreader has an average anisotropic thermal conductivity. For example, the particles may include graphite particle which have a preferred orientation within the heat-spreader 13.

Graphite particles typically have a platelet shape in which the long direction has a higher thermal conductivity than the short direction. The platelets may be arranged such that the long directions of the platelets may, on average, extend in directions substantially parallel to the major surface 16 of the semiconductor die 11 and the thickness of the platelets may extend in directions substantially perpendicular to the major surface 16 of the semiconductor die 11.

Graphite behaves has an anisotropic thermal conductivity due to the orientation of the poly crystalline structures substantially arranged in the ab plane and the weak Van der Waals bonds in the c axis which bond the polycrystalline planes to one another. This leads to graphite delaminating and chipping in between poly crystalline planes by breakage of the Van der Waal's forces.

Graphite materials may have a lateral thermal conductivity, i.e. in the long direction, of up to 500 W/m-k for natural graphite and up to 1500 W/m-k for engineered graphite. The thermal conductivity of graphite in the vertical direction, i.e. the short direction of the platelet, is around 10 W/m-k. Therefore, a thermal conduction anisotropic ratio of at least around 50 to 1 may be provided.

In some embodiments, the graphite may be coated and/or the graphite may be sandwiched between two metal sheets, for example copper sheets to improve the workability of the heat-spreader composite. The particles may be sandwiched between a first metallic layer and a second metallic layer of the heat-spreader 13.

The electronic component 10 is not limited to a having single semiconductor die 11. The semiconductor die may include two or more semiconductor dice which may be electrically coupled to provide a particular circuit, for example a half-bridge circuit or a power stage. In some embodiments, the electronic component 10 includes one or more transistor devices, such as one or more MOSFETs, insulated gate bipolar transistors (IGBT) or bipolar junction transistors (BJT). One or more of the semiconductor dice may be a diode, or a control device, such as a gate driver may be provided in addition to a half-bridge circuit including two transistor devices.

In embodiments including at least one transistor device, the transistor device may be a vertical device with contacts on two opposing major surfaces. The transistor device may be a high-voltage device or a low-voltage device.

In embodiments in which the semiconductor die 11 includes contacts on two opposing major surfaces, a first electrically conductive layer 18 may be arranged on a first major surface 16 of the semiconductor die 11 and may extend over neighbouring regions of the upper surface 19 of the first dielectric layer 12 to provide a redistribution structure. A second electrically conductive layer 20 may be arranged on a second major surface 21 of the semiconductor die 11 and may further extend over regions of the lower surface 22 of the first dielectric layer 12 to provide a redistribution structure and/or outer contact pad of the electronic component 10.

If the semiconductor die 11 is a vertical transistor device, the first electrically conductive layer 18 may be coupled to a drain electrode and portions of the second electrically conductive layer 20 may be electrically coupled to the source electrode and to the gate electrode of the transistor device. Portions of the second electrically conductive layer 20 may also be coupled to the first electrically conductive layer 18 and to the drain electrode. The second electrically conductive layer may provide the outer contacts pads of the electronic component 10.

The first electrically conductive layer 18 may be surrounded by a first dielectric planarization layer 23 and the second electrically conductive layer 20 may be surrounded by a second dielectric planarization layer 24 such that the lower surfaces of the second dielectric planarization layer 24 and the second conductive layer 20 are substantially coplanar. The upper surface of the electrically conductive layer 18 and of the first dielectric planarization layer 23 may also be substantially coplanar and the heat-spreader 13 and second dielectric layer 14 may be arranged directly on the first electrically conductive layer 18 and the first dielectric planarization layer 23.

The first dielectric layer 12 and the second dielectric layer 14 each include a glassfibre-reinforced epoxy resin such as FR4. Such glassfibre-reinforced epoxy resins may be used as the core layer in a printed circuit board, for example. The first and second dielectric planarization layers 23, 24 may include a dielectric such as polyimide. The materials of the first and second planarization layers 23, 24 may be photosensitive such that these layers can be structured using photolithographic techniques. The first electrically conductive layer 18 and the second electrically conductive layer 20 may include a metal, such as copper, or an alloy.

The heat-sink 15 may have an upper surface 25 which is substantially parallel to the major surface 16 of the semiconductor die 11 and may have a substantially planar form. However, the heat-sink 15 may also include protrusions such as fins protruding from the upper surface 25. The fins may be used to increase the outer surface area of the heat-sink 15 and to assist in increasing heat dissipation from the heat-sink 15.

Figure 2:
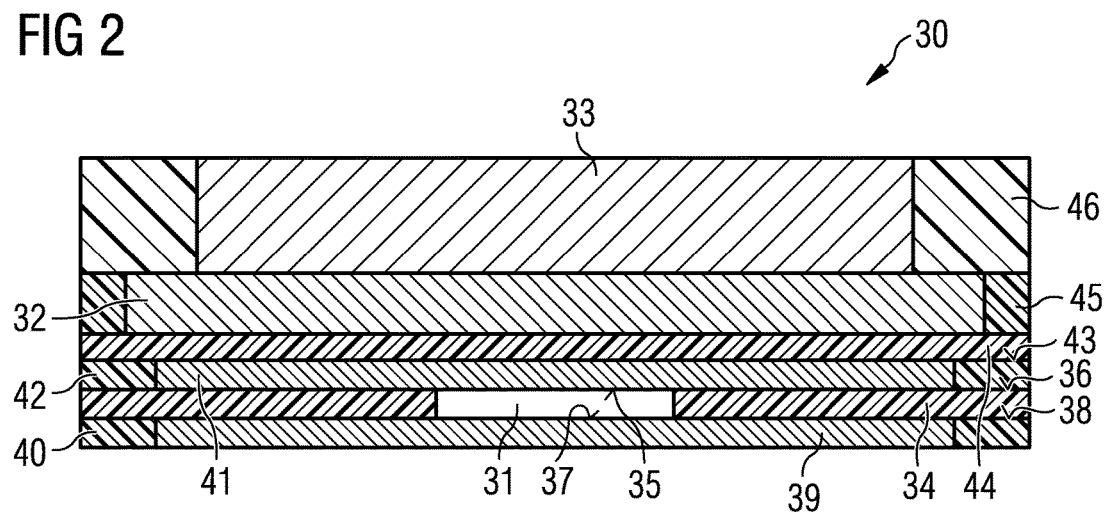
FIG. 2 illustrates a schematic cross-sectional view of an electronic component according to a second embodiment.

FIG. 2 illustrates a schematic cross-sectional view of an electronic component 30 according to a second embodiment. The electronic component 30 includes a semiconductor die 31, a heat-spreader 32 with anisotropic thermal conductivity and a heat-sink 33. The first semiconductor die 31 is embedded in a first dielectric layer 34 including a glassfibre-reinforced composite. The first dielectric layer 34 may include a glassfibre-reinforced composite board, such as FR4 for example. A first major surface 35 of the semiconductor die is substantially coplanar with a first surface 36 of the first dielectric layer 34 and a second major surface 37 of the semiconductor die 31 is substantially coplanar with a second surface 38 of the first dielectric layer 34.

The electronic component 30 includes a first electrically conductive layer 39 arranged on the second major surface 37 of the semiconductor die 31 and on the second surface 38 of the first dielectric layer 34. The first electrically conductive layer 39 is electrically coupled to the semiconductor die 31. The first electrically conductive layer 39 surrounded by a first dielectric planarization layer 40 which is positioned on portions of the first second surface 38 of the first dielectric layer 31 such that the lower surface 47 of the first dielectric planarization layer 40 and the lower surface 48 of the first dielectric planarization layer 40 are substantially coplanar.

The electronic component 30 further includes a second electrically conductive layer 41 arranged on the first major surface 35 semiconductor die 31 and the first surface 36 of the first dielectric layer 34. The second electrically conductive layer 41 is surrounded by a second planarization layer 42 such that the common upper surface 43 of the second electrically conductive layer 41 and the second dielectric planarization layer 42 is substantially coplanar.

If the semiconductor die 31 is a vertical transistor device, portions of the first electrically conductive layer 39 may be may be electrically coupled to the source electrode and to the gate electrode of the transistor device. The second electrically conductive layer 41 may be coupled to a drain electrode. Portions of the first electrically conductive layer 39 may also be coupled to the second electrically conductive layer 41 and to the drain electrode. The first electrically conductive layer 39 may provide the outer contacts pads of the electronic component 10.

A further dielectric layer 44 is positioned on the upper surface 43 of the second electrically conductive layer 41 and the second planarization layer 42. Heat-spreader is 32 embedded in a second dielectric layer 45 which is arranged on the further dielectric layer 44. A heat-sink 33 is embedded in a third dielectric layer 46. The third dielectric layer 46 and the heat-sink 33 are arranged on the heat-spreader 32 and second dielectric layer 45.

The heat-spreader 32 has anisotropic thermal conductivity and is configured such that the thermal conductivity in directions substantially parallel to the major surfaces 35, 37 of the semiconductor die 31 is higher than thermal conductivity in directions substantially perpendicular to the major surfaces 35, 37 of the semiconductor die 31. The heat-spreader 32 may include a material having a thermal conductivity which is higher in directions substantially parallel to the major surface 35, 37 of the semiconductor die 31 than in directions substantially perpendicular to the major surfaces 35, 37. For example, heat-spreader may include a layer of graphite particles which have a physical arrangement, in particular, a preferred texture, such that the desired orientation of the anisotropic thermal conductivity is provided. In embodiments in which the heat-spreader includes graphite particles, the graphite particles may be contained between two metallic layers, for example metallic foils.

The heat-sink 33 is thermally coupled to the heat-spreader 32 and may have a thermal conductivity which is substantially isotropic. The heat-sink 33 may or may not be electrically coupled to the heat-spreader 32. The heat-spreader 32 and heat-sink 33 may be electrically insulated from the semiconductor die 31 and conductive layers 39, 41, for example by the further dielectric layer 44, but thermally coupled to the semiconductor die 31.

The electronic component 30 may be considered to include a plurality of dielectric boards arranged in a stack, whereby a semiconductor die, heat-spreader and heat-sink are embedded in different dielectric layers of the stack. The first dielectric layer 34, the second dielectric layer 45 and the third dielectric layer 46 may each include a pre-fabricated board with a through-hole configured to accommodate the semiconductor die 31, heat-spreader 32 and heat-sink 33, respectively.

To produce the electronic component 30, the semiconductor die 31 may be inserted into the through-hole in the board providing the first dielectric layer 34 and secured in the through-hole by adhesive, for example, and the electrically conductive layers 39, 41 and the planarization layers 40, 42 applied. The board providing the second dielectric layer 45 may be attached to the first dielectric layer 34 such that the through-hole is positioned above the semiconductor die 31, the heat-spreader 32 inserted into the through-hole and attached to the semiconductor die 31, first dielectric layer 34 and second dielectric layer by an adhesive, for example. The heat-sink 33 may be attached to the heat-spreader 32, for example by adhesive. If a third dielectric layer 46 is provided, this may include a board or may be applied directly to the heat-sink 33.

Figure 3:
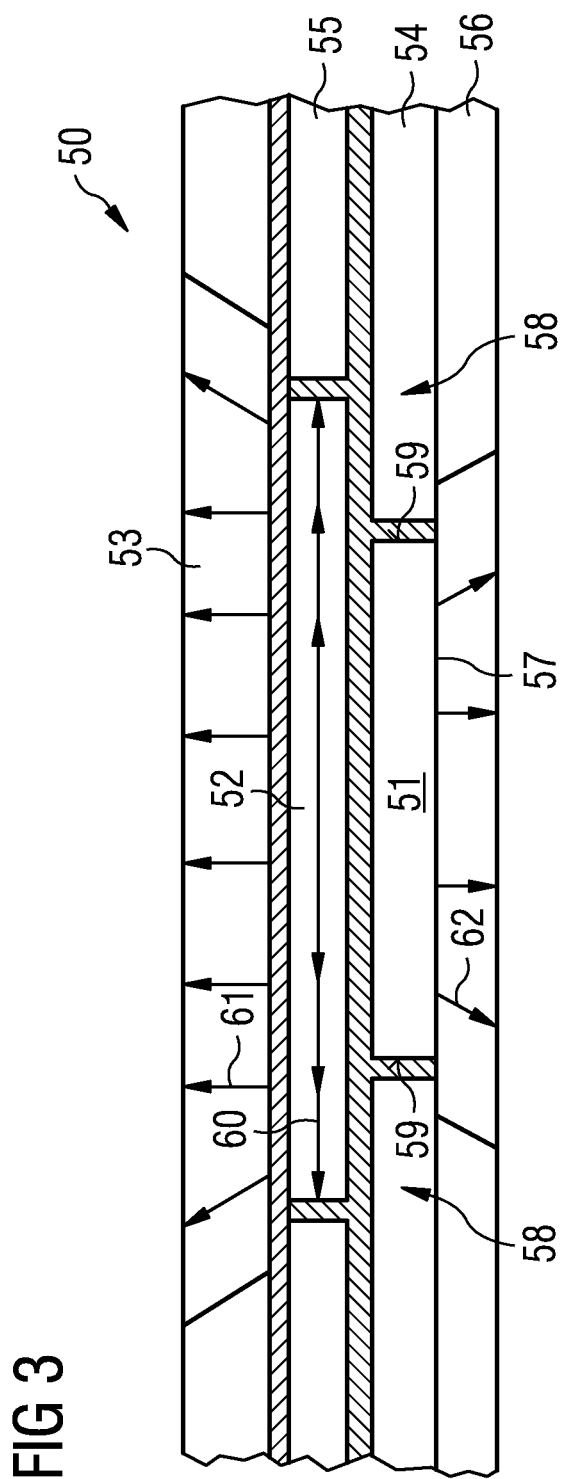
FIG. 3 illustrates a schematic cross-sectional view of heat dissipation paths in an electronic component.

FIG. 3 illustrates a schematic cross-sectional view of heat dissipation paths in an electronic component 50 including a semiconductor die 51, which generates heat during operation, a thermally anisotropic heat-spreader 52 arranged on the semiconductor die 51 and a heat-sink 53 arranged on the heat-spreader 52. The semiconductor die 51 is embedded in a first dielectric board 54 and the heat-spreader 52 is embedded in a second dielectric board 55. The heat-spreader 52 is mounted on and, thermally coupled to, the semiconductor die 51.

The heat-spreader 52 is configured to have a higher thermal conductivity in directions in the plane of the first dielectric board 55 than in directions perpendicular to the thickness of the first dielectric board 55. The heat-spreader 52 is configured to conduct heat to regions 58 of the electronic component 50 adjacent side faces 59 of the semiconductor die 51 as is indicated schematically by the arrows 60. The heat generated from by the semiconductor die 51 is conducted into regions 58 adjacent the semiconductor die 51 which are thermally coupled to the heat-sink 53. The heat-sink 53 has a substantially anisotropic thermal conductivity and is able to dissipate heat in directions substantially perpendicular to the major surfaces 57 of the semiconductor die 51 as is indicated schematically by the arrows 61. The heat generated by the semiconductor die 51 is therefore dissipated from a larger area than the lateral area of the semiconductor die 51 due to the lateral conduction of the heat by the heat-spreader 52.

By arranging the heat-spreader 52 and the heat-sink 53 in layers of the multilayer structure, a heat dissipation path can be provided for an embedded semiconductor die 51 within the package outline defined by the outer surfaces of the dielectric layers and the heat-sink. The peripheral regions of the heat-sink may have a higher thermal capacitance such that heat can be stored temporarily before it is dissipated into the environment such that it does not conduct laterally in the reverse direction back into the semiconductor die.

Within a package of a particular size and type, as the area of a semiconductor die decreases and the semiconductor device performance improves, the thermal resistance increases due to a higher power density and a small heat dissipation area. Some heat may be dissipated by the die pad or area which the die is mounted. However, the lateral distribution of the heat is limited to a relatively small angle.

The semiconductor die may be a high-voltage device such as a high-voltage transistor device which may have a breakdown voltage of 650 V and may be expected to operate 240 V in continuous operation. Such a device, the packaging isolation capable of resisting for breakdown blocking voltage may be seen by the device is desirable, a thermal capacitance sufficient to avoid overheating of the device in a short-circuit or short-circuit conditions is desirable, good thermal conduction and good isolation to heat-sink or large package external surfaces are desirable.

The dielectric layers of the electronic component provide the packaging of the electronic component. By embedding the heat-spreader in heat-sink in dielectric layers of the electronic component, the package of the electronic component is used as part of the heat dissipation circuit.

The dielectric layers may each be provided by a glassfibre-reinforced board, in which case each layer may be separately fabricated and the electronic component produced by mounting the dielectric layers on top of one another, for example using intervening adhesive layers.

Alternatively, the electronic component may be built up by first providing the dielectric layer with the embedded semiconductor die and appropriate planar rewiring structures, mounting a second dielectric layer on the first dielectric layer, inserting the heat-spreader into the second dielectric layer, mounted the third dielectric layer onto the second dielectric layer mounting heat-sink into the third dielectric layer.

The outer dimensions of the electronic component may be selected to provide the electronic component with a standard footprint or standard package outline.

A portion of the heat generated by the semiconductor die 51 in operation may also be dissipated from both sides of the semiconductor die 51. In an embodiment, a further layer 56 may be arranged on the opposing major surface 57 of the semiconductor die 51 and on the first dielectric board 54 to dissipate heat from the opposing surface of the semiconductor die 51, as is schematically indicated by the arrows 62. The layer 56 may be a heat-sink and may have a substantially isotropic thermal conductivity.

In an embodiment, a second heat-spreader may be provided on the opposing surface of the first dielectric board 54. The second heat-spreader may also have a thermally anisotropic conductivity with a higher thermal conductivity in directions substantially parallel to the major surfaces 57 of the semiconductor die 51 than in directions substantially perpendicular to the major surfaces 57 of the semiconductor die 51. In these embodiments, a further heat-sink may be provided which is arranged on the second heat-spreader.

FIG. 4 illustrates a schematic cross-sectional view of a heat-spreader 70 according to a first embodiment which may be embedded in a dielectric layer of a multilayer electronic component such as the electronic component according to one of embodiments described herein.

The heat-spreader 70 has a composite structure and includes a plurality of thermal capacitance members 71 which protrude into, and partially interrupt, a body 72 of the heat-spreader 70. The body 72 of the heat-spreader 70 has a higher thermal conductivity in lateral directions, indicated schematically in FIG. 4 by the arrow 73, than in vertical directions, indicated schematically in FIG. 4 with the arrow 74. The body 72 is bounded on a first surface 75 by a planar metallic layer such as a first metallic foil 76 and is bounded on the opposing major surface 77 by a second metallic foil 78.

The plurality of thermal capacitance members 71 may have a generally cylindrical shape and be spaced at intervals in the body 72 of the heat-spreader 70. Each of the thermal capacitance members 71 has a vertical thermal conductivity indicated with the arrow 79 in FIG. 4 that is greater than the vertical thermal conductivity of the body 72 of the heat-spreader 70. The vertical thermal conductivity of the body 72 is indicated in FIG. 4 by the arrows 74.

The thermal capacitance members 71 may include a metal such as copper, for example, and the body 72 may include a material having an anisotropic thermal conductivity, such as graphite particles. The graphite particles have a preferred texture or orientation to provide a higher thermal conductivity in lateral directions and vertical directions.

The plurality of thermal capacitance members may be positioned in regions of the heat-spreader 70 arranged adjacent and peripheral to the side faces of the semiconductor die such that the heat-spreader 70 and an additional heat-sink, which is thermally coupled to the heat-spreader 70, provide a heat dissipation path from the one or more semiconductor device which has a lateral thermal resistance which increases with increasing distance from the one or more semiconductor devices. By increasing the lateral thermal resistance with increasing distance from the one or more semiconductor devices, increasing heat dissipation out of the plane of the heat-spreader, i.e. vertically, is provided at increasing distance from the semiconductor die. The material providing the body 72 of the heat-spreader 70 is, however, continuous throughout the body 72 thus enabling heat to be conducted laterally in the higher thermal conductivity direction throughout the lateral area of the heat-spreader 70.

The composite structure of the heat-spreader including a body having a higher thermal conductivity in directions in lateral directions and in vertical directions and a plurality of thermal capacitance members is not limited to this arrangement and may have different arrangements.

FIG. 5 illustrates a heat-spreader 80 has a composite structure according to a second embodiment including a body 81 including material having a higher thermal conductivity lateral directions, as is indicated with reference number 82, than in vertical directions, as is indicated with the reference number 83, which is clad on two opposing major surfaces 84 by metallic foil 85, 86. The composite structure also includes protruding portions 87 which protrude into the body 81, partially interrupting the cross-sectional area of the body 81. The protruding portions 87 protrude into the body 81 alternately from the first metallic foil 86 and from the second metallic foil 85 and each provide a thermal capacitance member.

The spacing between neighbouring protruding portions 87 may be uniform in regions of the heat-spreader 80 peripheral to the semiconductor die or may vary depending on the distance from the semiconductor die. Furthermore, the spacing between protruding portions arranged at common distance from the semiconductor die may also vary according to the lateral distance from the semiconductor die. The position and spacing of the protruding portions may be selected to tailor the lateral thermal resistance of the heat-spreader 80.

The protruding portions may be provided blind vias which are introduced into the top or bottom surfaces of the heat-spreader and which are filled with metal, such as copper, using a plating process.

By adjusting the density of the vias relative to the distance from the heat source, a tailored relationship between the vertical and lateral conductivity within the heat-spreader can be provided. The blind vias may also increase the structural strength of the heat-spreader in the c-axis. Vias extending throughout the thickness of the body of the heat-spreader may also be used, but interrupt the thermal conductivity in the lateral directions to a greater extent.

Figure 6:
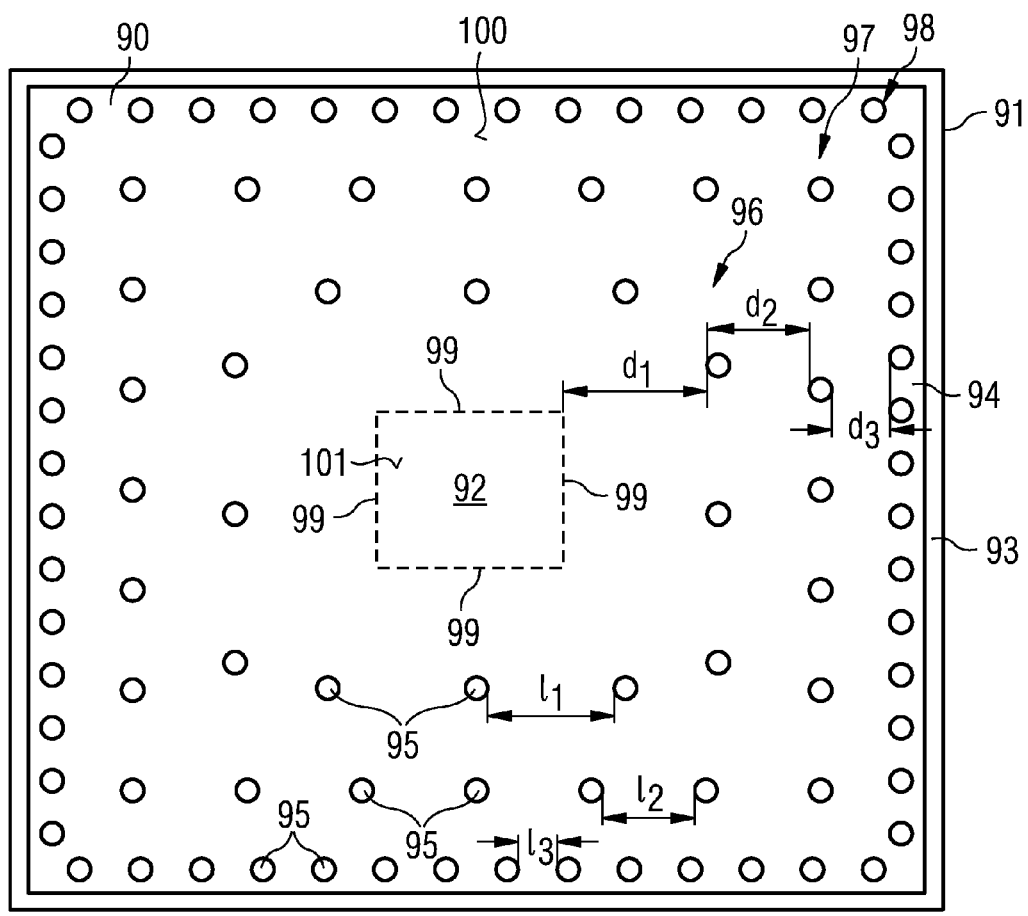
FIG. 6 illustrates a schematic top view of an electronic component according to a third embodiment.

FIG. 6 illustrates a schematic top view of a heat-spreader 90 of an electronic component 91 according to a third embodiment. The electronic component 91 includes a semiconductor die 92 embedded in a dielectric layer 93. A top view of the heat-spreader 90 is illustrated in FIG. 6. The heat-spreader 90 is arranged on the upper major surface 101 of the semiconductor die 92.

The heat-spreader 90 includes a body 94 including a material which has a higher thermal conductivity in lateral directions, that is in directions substantially parallel to the first major surface 101 of the semiconductor die 92, than in vertical directions, that is in directions perpendicular to major surface 101 of the semiconductor die 92. The heat-spreader 90 further in includes a plurality of thermal capacitance members 95 in the form of cylindrical protrusions which protrude into the body 94 of the heat-spreader 90.

As can be seen in the top view of FIG. 6, the plurality of thermal capacitance members 95 are arranged in three concentric rings 96, 97, 98 surrounding the semiconductor die 92. The distance $d_1$ between side faces 99 of the semiconductor die 92 and the first ring 96 of thermal capacitance members 95 is greater than the lateral distance $d_2$ between the first ring 96 and the second ring 97 of the thermal capacitance members 95. The distance $d_3$ between the second ring 97 and the third ring 98 of thermal capacitance members 95 is less than the distance $d_2$ between the first ring 96 and the second ring 97 of thermal capacitance members.

The distance $l_1$ between thermal capacitance members 95 of the third ring 98 is less than the distance $l_2$ between neighbouring thermal capacitance members 95 of the second ring 97 which, in turn, is less than the distance $l_3$ between thermal capacitance members 95 of the first ring 96.

Whilst the thermal capacitance members have been illustrated as having a cylindrical form, the lateral form is not limited to this particular arrangement. For example, the lateral form could be square, rectangular, hexagonal, slot-like, for example. The exact number of thermal capacitance members in each of the rings 96, 97, 98 is also not limited to the number illustrated in FIG. 6, but may vary depending on the thermal resistance which is to prove be provided for the heat-spreader 90 at various distances from the side faces 99 of the semiconductor die 92. The lateral arrangement of the thermal capacitance members is not limited to a ring-based arrangement. For example, the thermal capacitance embers may be arranged irregularly or regularly in the regions of the heat-spreader peripheral to the side faces 99 of the semiconductor die 92.

A heat-sink may be mounted on the upper surface 100 of the heat-spreader 90. The thermal capacitance members 95 may protrude from an upper metallic layer and/or lower metallic layer as, for example, illustrated in the embodiments of FIGS. 4 and 5.

Figure 7:
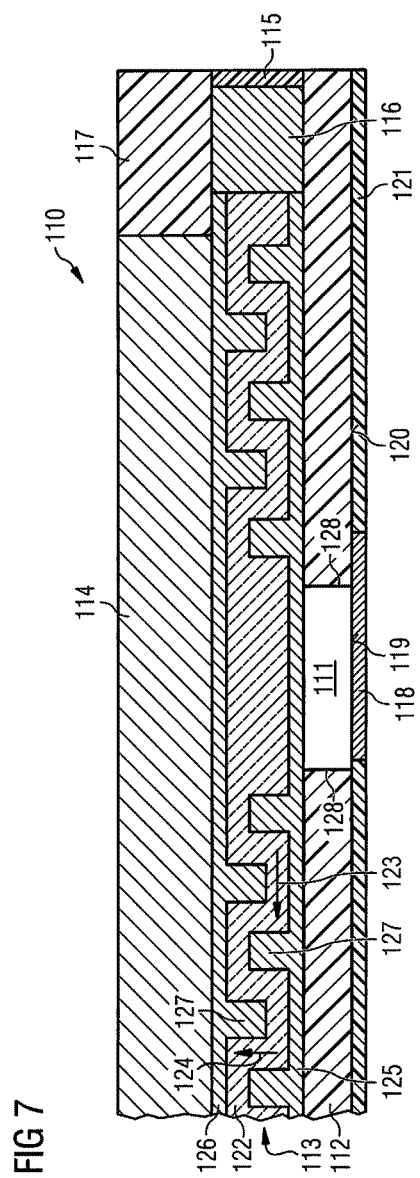
FIG. 7 illustrates a partial cross-sectional view of an electronic component according to a fourth embodiment.

FIG. 7 illustrates a partial cross-sectional view of an electronic component 110 according to a fourth embodiment. The electronic component 110 includes a semiconductor die 111 embedded in a first dielectric layer 112, a heat-spreader 113 arranged on the semiconductor die 111 and on the first dielectric layer 112 and a first heat-sink 114 arranged on the heat-spreader 113. The heat-spreader 113 is embedded in a second dielectric layer 115 which is mounted on the first dielectric layer 112. The first heat-sink 114 is embedded in a third dielectric layer 117 which is arranged on the second heat-sink 116 and on the second dielectric layer 115. A second heat-sink 116 is arranged in peripheral regions of the second dielectric layer 115 and is thermally coupled to the heat-spreader 113. The second heat-sink 116 may have a ring-form, for example. The second heat-sink 116 may extend to the outermost surfaces of the electronic component 110, in which case the second dielectric layer 115 may be omitted.

The electronic component 110 further includes an electrically conductive layer 118 positioned on a first major surface 119 of the semiconductor die 111 which also extends onto the lower surface 120 of the first dielectric layer 112. The semiconductor die 111 is sandwiched between the heat-spreader 113 and the electrically conductive layer 118. The lower surface 120 of the first dielectric layer 112 may further include a dielectric planarization layer 121 having a thickness substantially corresponding to that of the electrically conductive layer 118. The electrically conductive layer 118 may provide an outer contact of the electronic component 110.

The heat-spreader 113 includes a body 122 including a material configured such that the body 122 has a thermal conductivity in directions parallel to a major face 119 of the semiconductor die 111, which is indicated with the reference number 123, which is higher than the thermal conductivity in directions perpendicular to the major surface 119 of the semiconductor die 111, which is indicated with the reference number 124. The heat-spreader 113 further includes a first metallic layer 125 and a second metallic layer 126 which bound the major surfaces of the body 122. Protrusions 127 which extend into the body 122 provide thermal capacitance members. The protrusions 127 are arranged within the heat-spreader 113 adjacent and peripheral to the side faces 128 of the semiconductor die 111. The protruding portions 127 protrude alternately from the first metallic layer 125 and from the second metallic layer 126.

The first metallic layer 125 may be electrically coupled to the semiconductor die 111 or an additional dielectric layer may be provided between the semiconductor die 111 and the first metallic layer 125 such that the semiconductor die is electrically insulated from the first metallic layer 125 and from the heat-spreader 113.

The second heat-sink 116 may be used to assist in storing the heat conducted along the plane of the heat-spreader 113 to the periphery before it is dissipated by the first heat-sink 114 and by the second heat-sink 116 into the surroundings. A heat dissipation path from the semiconductor die 111 is provided which is initially substantially lateral and then substantially vertical. This enables the heat to be dissipated from a greater lateral area than if a substantially anisotropic heat-sink were to be attached directly to the semiconductor die 111 since heat is conducted to peripheral regions of the heat-sink 114 by the intermediately arranged heat-spreader 113.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures.

Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An electronic component, comprising:
one or more semiconductor dice that forms at least one transistor device, embedded in a first dielectric layer;
a heat-spreader embedded in a second dielectric layer, wherein the heat-spreader has a higher thermal conductivity in directions substantially parallel to the major surface of the one or more semiconductor dice than in directions substantially perpendicular to the major surface of the one or more semiconductor dice, and
a heat-sink thermally coupled to the heat-spreader,
wherein the one or more semiconductor dice form a half-bridge circuit, and
wherein the heat-spreader comprises a first metal foil, a second metal foil and graphite particle arranged between the first and second metal foil and metal filled blind vias introduced in at least one of the first metal foil and the second metal foil.

2. The electronic component according to claim 1, wherein the heat-spreader is configured to conduct heat to areas adjacent the side faces of the one or more semiconductor dice.

3. The electronic component according to claim 1, wherein the heat-sink has a thermal conductivity in directions substantially perpendicular to the major surface of the one or more semiconductor dice that is higher than the thermal conductivity of the heat-spreader in directions substantially perpendicular to the major surface of the one or more semiconductor dice.

4. The electronic component according to claim 1, wherein the heat-sink is embedded in a third dielectric layer that is arranged on the second dielectric layer.

5. The electronic component according to claim 1, wherein the heat-spreader and the heat-sink provide a heat dissipation path from the one or more semiconductor dice having a lateral thermal resistance which increases with increasing distance from the one or more semiconductor dice.

6. The electronic component according to claim 1, further comprising a plurality of thermal capacitance members having a vertical thermal conductivity that is greater than the vertical thermal conductivity of the heat-spreader, the plurality of thermal capacitance members being arranged laterally adjacent the one or more semiconductor dice.

7. The electronic component according to claim 6, the plurality of thermal capacitance members protruding into and partially interrupting the heat-spreader.

8. The electronic component according to claim 6, wherein the plurality of thermal capacitance members protrudes from a first side into the heat-spreader and from at second side into the heat-spreader.

9. The electronic component according to claim 6, wherein the spacing between adjacent ones of the plurality of thermal capacitance members decreases with increasing distance from the one or more semiconductor dice.

10. The electronic component according to claim 6, wherein the spacing between adjacent ones of the plurality of thermal capacitance members at an increasing common distance from the one or more semiconductor dice decreases.

11. The electronic component according to claim 1, wherein the heat-spreader comprises particles having an anisotropic arrangement such that the heat-spreader comprises an anisotropic thermal conductivity.

12. The electronic component according to claim 11, wherein the particles comprise graphite.

13. The electronic component according to claim 11, wherein the heat-spreader comprises a first metallic layer and a second metallic layer and the particles are arranged between the first metallic layer and the second metallic layer.

14. The electronic component according to claim 1, further comprising at least one electrically conductive contact layer electrically coupled to one or more semiconductor dice.

15. The electronic component according to claim 1, wherein one or more of the semiconductor dice comprises a vertical transistor device having a first current contact pad arranged on a first surface and a second current contact pad arranged on a second surface, the second surface opposing the first surface, a first electrically conductive contact layer which is electrically coupled to the first current contact pad and a second electrically conductive layer which is electrically coupled to the second current contact pad.

16. The electronic component according to claim 1, wherein the heat-spreader is electrically isolated from the one or more semiconductor dice by a fourth dielectric layer.

17. The electronic component according to claim 1, wherein the one or more semiconductor dice comprise a first major surface which is substantially coplanar with a first major surface of the first dielectric layer and a second major surface which is substantially coplanar with a second major surface of the first dielectric layer.

18. The electronic component according to claim 1, further comprising a second heat-sink arranged in the peripheral region of the second dielectric layer, the second heat-sink being thermally coupled to the heat-spreader.

19. The electronic component according to claim 1, wherein the heat sink is substantially planar and provides an outermost surface of the electronic component.

20. The electronic component according to claim 1, wherein the heat spreader and the heat sink have a lateral area greater than the semiconductor die.

21. The electronic component according to claim 1, wherein the heat spreader and the heat sink are embedded in dielectric layers.

22. The electronic component according to claim 1, wherein peripheral regions of the heat sink have a higher thermal capacitance than a central region of the heat sink.

23. The electronic component according to claim 13, wherein the first and second metallic layers are provided by a metal foil.

24. The electronic component according to claim 1, wherein the transistor device is a high-voltage device with a breakdown voltage of at least 650 V.

25. An electronic component, comprising:
one or more semiconductor dice embedded in a first dielectric layer;
a heat-spreader embedded in a second dielectric layer, wherein the heat-spreader has a higher thermal conductivity in directions substantially parallel to the major surface of the one or more semiconductor dice than in directions substantially perpendicular to the major surface of the one or more semiconductor dice,
a plurality of thermal capacitance members having a vertical thermal conductivity that is greater than the vertical thermal conductivity of the heat-spreader, the plurality of thermal capacitance members being arranged laterally adjacent the one or more semiconductor dice, the plurality of thermal capacitance members having greater structural strength than the heat-spreader and protruding into and partially interrupting the heat-spreader, and
a heat-sink thermally coupled to the heat-spreader.

26. The electronic component according to claim 25, wherein the thermal capacitance members comprise metal filled blind vias.

27. The electronic component according to claim 1, wherein the heat-spreader comprises a foil with protruding portions which protrude into the heat spreader and provide thermal capacitance members.

* * * * *